(12) United States Patent
Misra et al.

(10) Patent No.: US 6,958,485 B2
(45) Date of Patent: Oct. 25, 2005

(54) HYBRID MOLECULAR MEMORY DEVICES AND METHODS OF USE THEREOF

(75) Inventors: Veena Misra, Raleigh, NC (US); Srivardhan Gowda, Raleigh, NC (US); Guru Mathur, Raleigh, NC (US)

(73) Assignee: North Carolina State University, Raleigh, NC (US)

(*) Notice: Subject to any disclaimer, the term of this patent is extended or adjusted under 35 U.S.C. 154(b) by 108 days.

(21) Appl. No.: 10/729,144

(22) Filed: Dec. 5, 2003

(65) Prior Publication Data

US 2005/0121660 A1    Jun. 9, 2005

(51) Int. Cl.[7] .............................................. H01L 29/06
(52) U.S. Cl. ........................ 257/10; 427/384; 429/213
(58) Field of Search ........................ 427/384; 429/213

(56) References Cited

U.S. PATENT DOCUMENTS

| | | | |
|---|---|---|---|
| 6,128,214 A | 10/2000 | Kuekes et al. | |
| 6,208,553 B1 | 3/2001 | Gryko et al. | |
| 6,212,093 B1 | 4/2001 | Lindsey | |
| 6,451,942 B1 | 9/2002 | Li et al. | |
| 2005/0019500 A1 * | 1/2005 | Bocian et al. | |

OTHER PUBLICATIONS

U.S. Appl. No. 10/628,868, filed Jul. 28, 2003, Bocian et al.
Gowda et al., *Hybrid Silicon/Molecular Memories: Co-Engineering for Novel Functionality* (2003).

* cited by examiner

*Primary Examiner*—David Nelms
*Assistant Examiner*—Mai-Huong Tran
(74) *Attorney, Agent, or Firm*—Myers, Bigel, Sibley & Sajovec, PA (57) ABSTRACT

The present invention provides hybrid microelectronic memory device, comprising: (a) a substrate having a surface, a first region of first work function adjacent the surface, and a second region of second work function adjacent the surface and adjacent the first region; (b) a film comprising redox-active molecules on the first and second regions; and (c) an electrode connected to the film. The present invention further provides a hybrid microelectronic memory device, comprising: (a) a substrate having surface and a structure or region such as a diode for increasing the retention time of the device formed adjacent the surface; (b) a film comprising redox-active molecules on or associated with the region or structure; and (c) an electrode connected to the redox active molecules opposite the substrate surface. Methods of using such devices are also described.

31 Claims, 10 Drawing Sheets

HYBRID MOLECULAR MEMORY DEVICES AND METHODS OF USE THEREOF

This invention was made with Government support under grant no. MDA972-01-C-0072 from DARPA. The US Government has certain rights to this invention.

FIELD OF THE INVENTION

The present invention concerns memory devices such as non-volatile memory devices, and methods of making and using the same.

BACKGROUND OF THE INVENTION

Figure 1A:
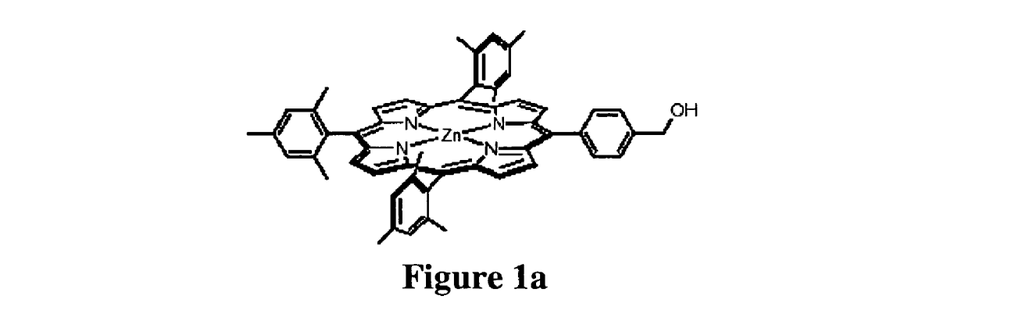
FIG. 1a. Molecular structure of an alcohol-derivatized Zn tetraaryl-porphyrin.

The advantages of molecular-based memory devices include nanoscale size, low voltage operation and multiple-state properties. Multiple-state behavior can be built into the molecular structure via molecular design and chemical synthesis. For example, the porphyrin molecule shown in FIG. 1a exhibits three states: neutral, monopositive, and dipositive [D. T. Gryko et al., J. Org. Chem., 64 (1999)]. More elaborate molecular structures have been devised that afford up to seven positively charged states [K. Schweikart, et al., J. S. J. Mater. Chem., 12 (2002); see also U.S. Pat. Nos. 6,128,214; 6,208,533; 6,272,038; and 6,212,093].

A hybrid semiconcutor/molecular approach, where molecules are integrated with silicon devices, can provide a bridge between CMOS-only and future molecular-only technologies [K. M. Roth et al., J. Vac. Sci. Technol. B, 18 (2000); C. P. Collier et al., Science, 285 (1999); S. K. Coulter, J. Vac. Sci. Technol. A, 18 (2000); K. M. Roth et al., J. Am. Chem. Soc., 125 (2003)]. However, little has been suggested in connection with such devices, and there is a need for new approaches to hybrid molecular memory devices.

SUMMARY OF THE INVENTION

The present invention provides a complementary route to obtain multiple states that in some embodiments utilizes relatively simple molecules (with as few as two states) in conjunction with engineered substrates.

A first aspect of the present invention is a hybrid microelectronic memory device, comprising: (a) a substrate having a surface, a first region of first work function adjacent the surface, and a second region of second work function adjacent the surface and adjacent the first region; (b) a film comprising redox-active molecules on the first and second regions; and (c) an electrode connected to the film.

A second aspect of the present invention is a method of storing data, comprising: (a) providing an apparatus as described above, and (b) applying a voltage to the electrode to set an oxidation state of the redox active molecules. The redox active molecules adjacent the first region include a different oxidation state from the redox active molecules adjacent the second region.

A third aspect of the present invention is a hybrid microelectronic memory device, comprising: (a) a substrate having surface and a structure or region formed adjacent the surface; (b) a film comprising redox-active molecules on or associated with the region or structure; and (c) an electrode connected to the redox active molecules opposite the substrate surface. In preferred embodiments the structure or region formed adjacent the structure is one that depletes minority carriers from the region or structure associated with the minority carriers to enhance or increase the retention time of the device.

A fourth aspect of the present invention is a method of storing data, comprising: (a) providing an apparatus as described above, and (b) applying a voltage to the electrode to set an oxidation state of the redox active molecules.

The present invention is explained in greater detail in the drawings herein and the specification set forth below.

BRIEF DESCRIPTION OF THE DRAWINGS

FIGS. 3(b) and (c) Energy band diagrams for oxidation and reduction of the molecules respectively. The former corresponds to the read cycle while the latter corresponds to the write cycle.

FIG. 3(d) Schematic equivalent of the electrical connections for characterization.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers (such as an oxide layer on a metal) may also be present. Also, while embodiments of the invention are explained with reference to first and second regions, it will be appreciated that additional regions (e.g., a third, fourth, etc.) of different conductivity type may also be included if desired, and hence the claims are to be construed as open-ended unless expressly made closed-ended.

Applicants specifically intend that the disclosures of all United States patent references cited herein be incorporated herein by reference in their entirety.

Substrates that can be used to carry out the present invention include any suitable microelectronic substrate or semiconductor substrate, examples of which include but are not limited to substrates formed of or comprising silicon, silicon carbide, gallium nitride, gallium arsenide, germanium, silicon-germanium, and combinations thereof.

Metals that may be used as electrodes or metal layers to carry out the present invention include but are not limited to tantalum, tungsten, copper, ruthenium, titanium, nickel, cobalt, hafnium, gold, aluminum, and alloys thereof.

Any suitable redox active molecule may be used in the present invention, including but not limited to porphyrinic macrocycles, metallocenes such as ferrocene, linear polyenes, cyclic polyenes, tetrathiafulvalenes, tetraselenafulvalenes, metal coordination complexes, sandwich coordination compounds (e.g., double-decker and triple-decker sandwich coordination compounds), triarylamines, 1,4-phenylenediamines, xanthenes, flavins, phenazines, phenothiazines, acridines, quinolines, 2,2'-bipyridyls, 4,4'-bipyridyls, tetrathiotetracenes, and peri-bridged naphthalene dichalcogenides, etc. Examples include but are not limited to those charge storage molecules or redox active molecules described in U.S. Pat. Nos. 6,128,214; 6,208,533; 6,272,038; and 6,212,093.

Films utilized in the present invention are in some embodiments characterized by a lack of substantial lateral conductivity (e.g., absence of lateral conductivity sufficient to obscure beyond use the different oxidation potentials that would otherwise be created in the device by the regions of different work functions). By "lateral conductivity" is meant conductivity substantially parallel or orthogonal to the surface of the substrate or device, recognizing that in some embodiments such a parallel path may travel along the contours of a non-planar surface. Films may be in any suitable form including monolayer or multilayer films, and may be continuous or interrupted films (e.g., have "holes" in some portions thereof).

As noted above, the present invention provides a hybrid microelectronic memory device comprising: (a) a substrate having a surface, a first region of first work function adjacent the surface, and a second region of second work function adjacent the surface and adjacent the first region; (b) a film comprising redox-active molecules on the first and second regions; and (c) an electrode connected to the film. The film is preferably characterized by the absence of substantial lateral conductivity. The first and second regions preferably differ in work function. Depending upon the embodiment of the invention, the difference in work function between the two adjacent regions will be at least 0.1, 0.2, 0.3, 0.4, or 0.5 eV. In some embodiments the first and second regions are spaced apart from one another. The first and second regions may be formed in a variety of ways. For example, the first and second regions may be doped regions in the substrate, N+ pockets in a p-well substrate or P+ pockets in an n-well substrate. In some embodiments the first and second regions are each stacked vertically on the surface, and can be metal or metal oxides (that differ in work function) on the substrate.

The deposition of electrodes including metal electrodes on substrates, and including metals deposited on substrates to form regions of different conductivity types, can be carried out by any suitable technique. Likewise the doping of regions in a substrate to form regions of different conductivity type may be carried out in accordance with techniques known in the art. See, e.g., U.S. Pat. Nos. 6,162,672; 5,943,584; 5,707,721; and 5,679,966.

Films of redox active molecules can be formed or deposited on substrates as described herein in accordance with any suitable technique, including but not limited to evaporation, solution attachment, vapor deposition, Langmuir-Blodget deposition, etc. The film can be a monolayer or multilayer film, and may or may not completely cover the surface portion, depending upon the particular embodiment of the invention.

As also noted above, the present invention also provides an additional device in which retention times may be potentially extended. Such a device generally comprises (a) a substrate having surface and a structure or region formed adjacent the surface; (b) a film comprising redox-active molecules on or associated with the region or structure; and (c) an electrode connected to the redox active molecules opposite the substrate surface. The structure or region formed adjacent the structure is one that depletes minority carriers from the region or structure associated with the minority carriers to enhance or increase the retention time of the device (e.g., reduce or prevent reduction of the redox active molecules once an oxidation state is set therein). In one the structure comprises a first region adjacent the surface, and a second region different from the first region on the first region, with the film on the second region, and wherein the first and second regions form a structure that depletes minority carriers from the second region. In some embodiments the first and second regions together form a diode. Thus in some embodiments the first region is n-doped and the second region is doped and in other embodiments the first region is p-doped and the second region is n-doped. In some embodiments the first region is n-doped and the second region comprises a metal, and in other embodiments the first region is p-doped and the second region comprises a metal. In still other embodiments, the first and second regions are each separate portions or sub-layers of a graded p-layer, or separate portions or sub-layers of a graded n-layer. In still other embodiments, the structure is formed by introducing metal impurites that form generation-recombinantion centers into the substrate. As will be appreciated by those skilled in the art in light of the teaching set forth herein, any structure that serves to deplete minority carriers can be utilized to increase retention times of the devices herein and hence carry out the present invention.

The devices of the present invention can be utilized as memory devices for the storage of information and in methods of use thereof in any suitable device or manner, including but not limited to those described in U.S. Pat. No. 6,208,553 to Gryko et al.; 6,272,038 to Clausen et al.; and U.S. Pat. No. 6,212,093 to Lindsey. In general, such methods comprise (a) providing an apparatus as described above, and (b) applying a voltage to the electrode to set an oxidation state of the redox active molecules. In the case of the devices incorporating structures such as diodes to extend retention times of the device, the methods may further comprise the step of biasing (e.g., reverse biasing) the diode to inhibit reduction of the redox active molecules and increase the retention time of the memory device. Accordingly, in some embodiments of the method, the memory device has a t1/2 of at least 200 seconds. The oxidation states of the redox active molecules can then be read or determined in accordance with known techniques to retrieve the data stored in the form of the set oxidation state of the redox active molecules.

In addition, certain devices of the present invention can be utilized as a "test bed" in methods to determine the lateral conductivity of redox-active molecules. Redox active molecules without substantial lateral conductivity can then be selected and utilized in the hybrid molecular memory devices described herein, or in any other device or application where the absence of substantial lateral conductivity of molecules deposited as a film is desired (e.g., for the reasons noted above). In general, such methods comprise the steps of (a) providing a substrate having a surface, a first region of first work function adjacent said surface, and a second region of second work function adjacent said surface and adjacent said first region; (b) depositing a film comprising redox-active molecules on said first and second regions; and (c) determining the presence of an additional oxidation state from said film due to the presence of said second region of second conductivity type to thereby determine the lateral cobnductivity of said redox-active molecule when deposited as a film on said substrate. The presence of the second oxidation state indicates the absence of substantial lateral conductivity of said redox active molecule deposited as a film on said substrate. The determining step can be carried out by any suitable technique, such as cyclic voltammetry.

The present invention is explained in greater detail in the following non-limiting Examples.

EXAMPLES

In these examples we report on the use of N+ (or P+) pockets embedded in p-well (or n-well) Si substrates as a means of obtaining multiple states from a two-state molecule. Another critical parameter for memory devices is charge-retention time. Values of the retention time can be tuned by alterations of the molecular design [K. M. Roth et al., Langmuir, 18 (2002); G. Mathur et al., IEEE Nano2003 (under publ.)]. In this work we also report on utilizing N+/P and P+/N diodes to increase the charge-retention times of redox-active monolayers. Both of these strategies illustrate engineering of the silicon component in hybrid silicon-molecular devices. We believe that co-engineering both the silicon and molecular components will enable access to novel device functionalities that may not be possible with silicon or molecular devices alone.

Figure 1B:
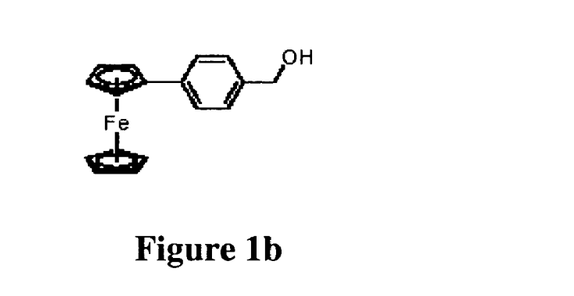
FIG. 1b. Molecular structure of Fc—BzOH.
Figure 2:
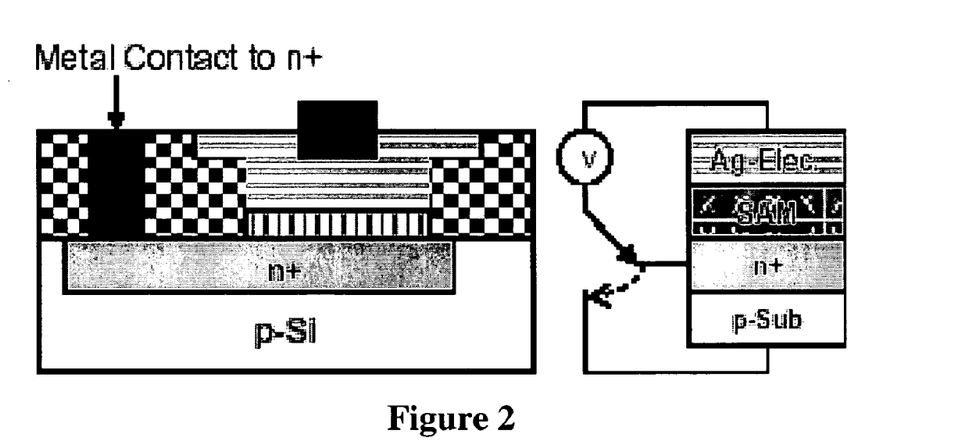
FIG. 2 (i) Schematic of an n+/p diode structure, with a self-assembled monolayer of Fc—BzOH attached on the n+. Gate electrolyte and Ag electrode are also shown. There is a metal contact to the n+ layer through the isolation SiO2. (ii) Schematic equivalent of the electrical connections made during characterization. Note that one end of the voltage source is connected to the silver electrode, while the other end is either connected to the n+ contact or the p-substrate (back side contact).

Experimental The redox-active compound used in this study was 4-ferrocenylbenzyl alcohol (Fc—BzOH), the structure of which is shown in FIG. 1b. The ferrocene unit exhibits two states: neutral and monopositive. A schematic of the basic molecular capacitor structure is shown in FIG. 2. The architecture of the capacitor contains electrolyte-molecule-silicon layers, denoted EMS. Arrays of N+ (P+) regions were formed in p-well (n-well) Si substrates with varying area ratios (Table 1a). In addition, N+/P and P+/N diodes, and N and P area capacitors were also fabricated. The ferrocene and porphyrin molecules of the type shown in FIG. 1 have demonstrated excellent thermal stability (up to 200–400° C.), excellent endurance, long retention times, high densities and low voltage redox potentials [see references above; see also Q. Li et al., Appl. Phys. Lett., 81 (2002); Q. Li et al., Appl. Phys. Lett., 82 (2003)]. The solution used to form a monolayer on silicon was prepared by dissolving 1 mg of Fc—BzOH in 200 $\mu$L of benzonitrile. The sample was maintained at 100° C. during the attachment procedure which has been described previously. Electrical analysis was performed using a CHI 600 electrochemical analyzer and an HP 4284A LCR meter. Characterization of charge-retention times was done by the open circuit potential amperometry (OCPA) technique using National Instruments LabVIEW and a UCR High-Bandwidth Current Monitor.

Figure 3A:
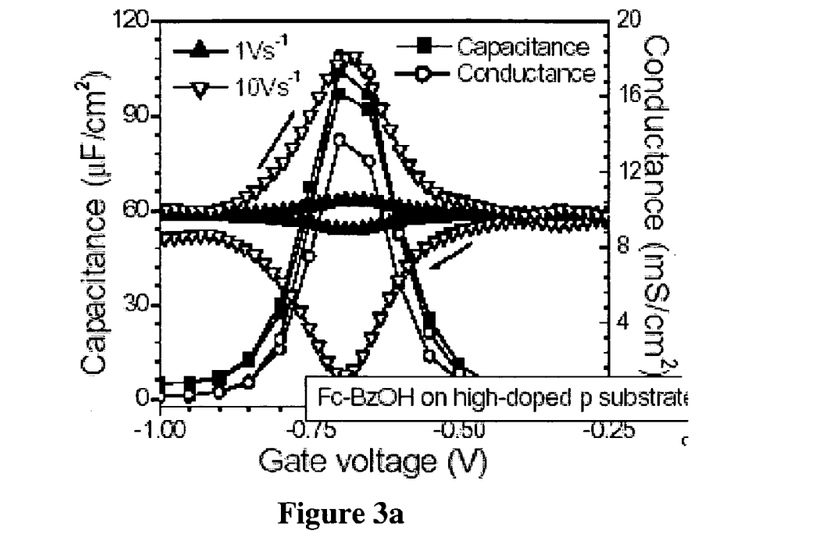
FIG. 3a. Cyclic voltammetry (CyV), capacitance and conductance voltage (CV and GV) of Fc—BzOH on high-doped p type substrate. Peaks in CV and GV correspond to those in CyV.
Figures 3B, 3C, 3D:
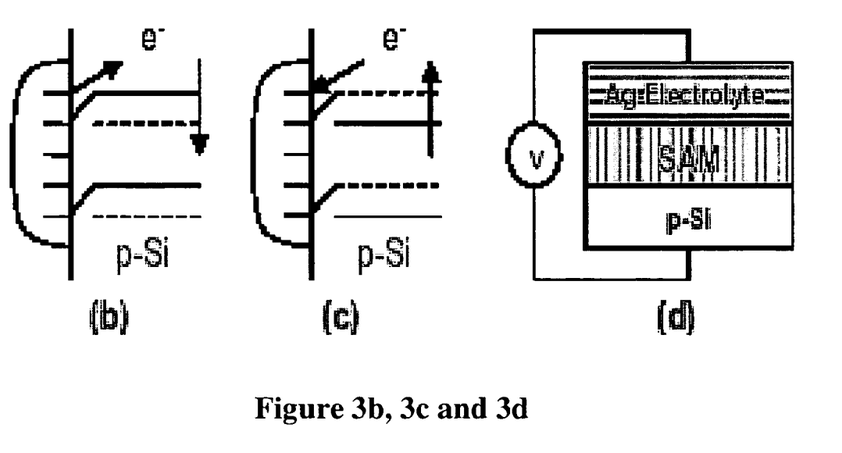

Results and Discussion. Cyclic voltammetry (CyV) and conventional capacitance-conductance (CV-GV) measurements were performed to characterize the Fc—BzOH attached to highdoped p–Si substrates. As shown in FIG. 3a, the peaks observed at −0.65V for all measurements are associated with the oxidation and reduction (redox) processes of the molecules. As shown in FIG. 3(b), the application of an oxidizing voltage causes each molecule to lose an electron to the Si substrate, resulting in a positively charged monolayer (written state). When a reducing voltage is applied, electrontransfer returns the molecules to the neutral state (erased state). The charge stored in the oxidized monolayer can be read either destructively by erasing and measuring the discharge current or non-destructively via a field effect transistor.

Figure 4:
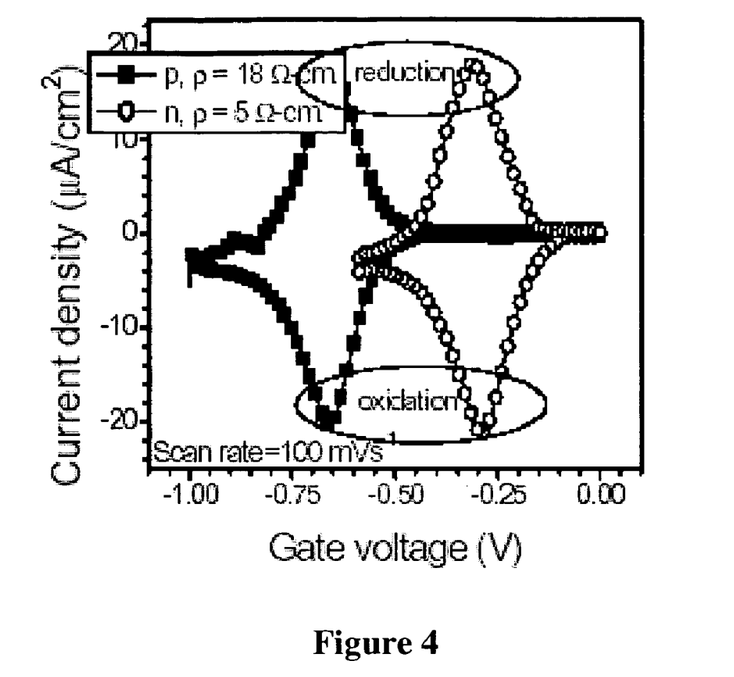
FIG. 4 CyV of Fc—BzOH attached to low-doped n and p type substrate at a scan rate of 100 mV/s.
Figure 5:
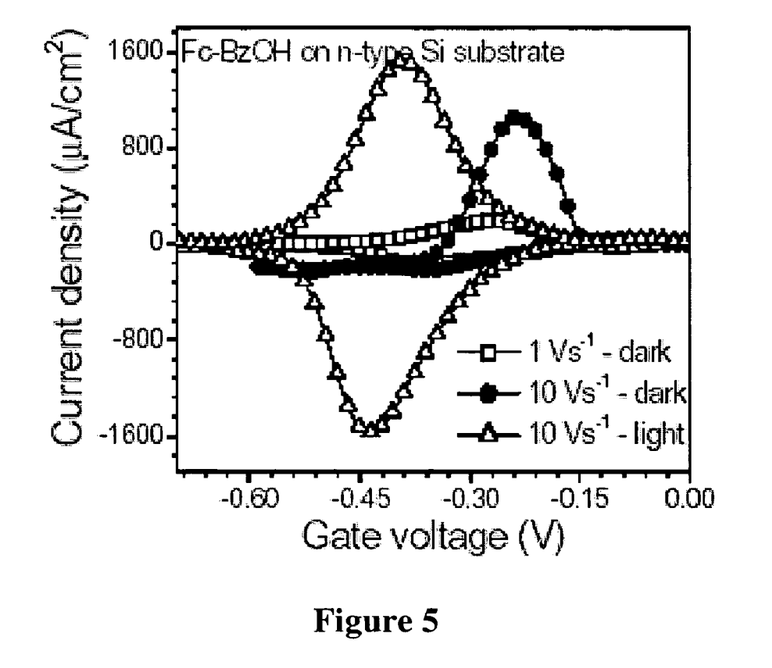
FIG. 5. CyV of Fc—BzOH on low-doped n type substrate: effect of scan rate and light on minority carrier generation and hence the oxidation peak.
Figure 6:
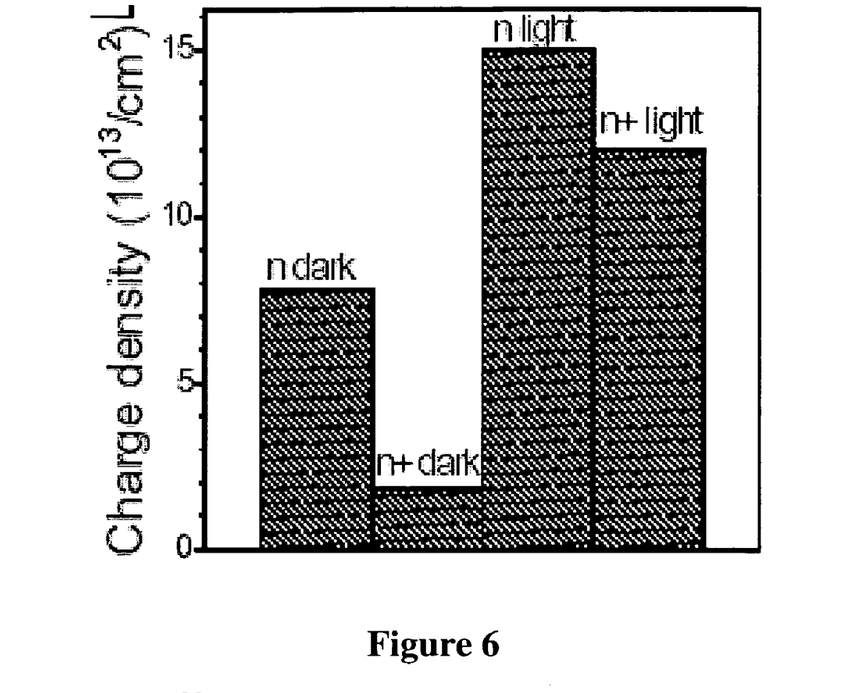
FIG. 6. Effect of light and doping density on oxidation of monolayer of Fc—BzOH on n substrate: charge density from CyV at 10 V/s.

Fc—BzOH self-assembled monolayers were also prepared on low-doped n or p substrates. In each case, the CyV measurement shows the expected redox peaks (FIG. 4). However, the oxidation peak potential is ~350 mV lower for n–Si than for p–Si. This observation is attributed to the alignment of the molecular Fermi level and the Fermi level of the surface, which is different for n and p–Si. In addition, any voltage drops that are associated with the contacts to these low doped substrates can also shift the redox potentials. The effect of the number of minority carriers in n–Si on the writing and erasing processes was examined in two ways, (i) by altering the scan rate and (ii) by illuminating the sample. As shown in FIG. 5, when the scan rate is increased from 1 V/s to 10 V/s, the oxidation peak shifted to a lower potential value and increased in intensity. Upon full illumination, the peak increased further in intensity and shifted to a higher potential value. Because the writing process requires that the electrons leaving the molecules recombine with holes in the substrate, the n–Si requires a source of minority carriers when the scan rates are high. The effects of illumination must originate with the underlying Si layer and not the Fc—BzOH monolayers. The dependence of observed redox behavior on minority carrier generation is shown in FIG. 6. As shown, the amount of charge measured is lower under dark conditions and for heavily doped substrates, both of which are conditions that reduce minority carrier concentration.

Figure 7A:
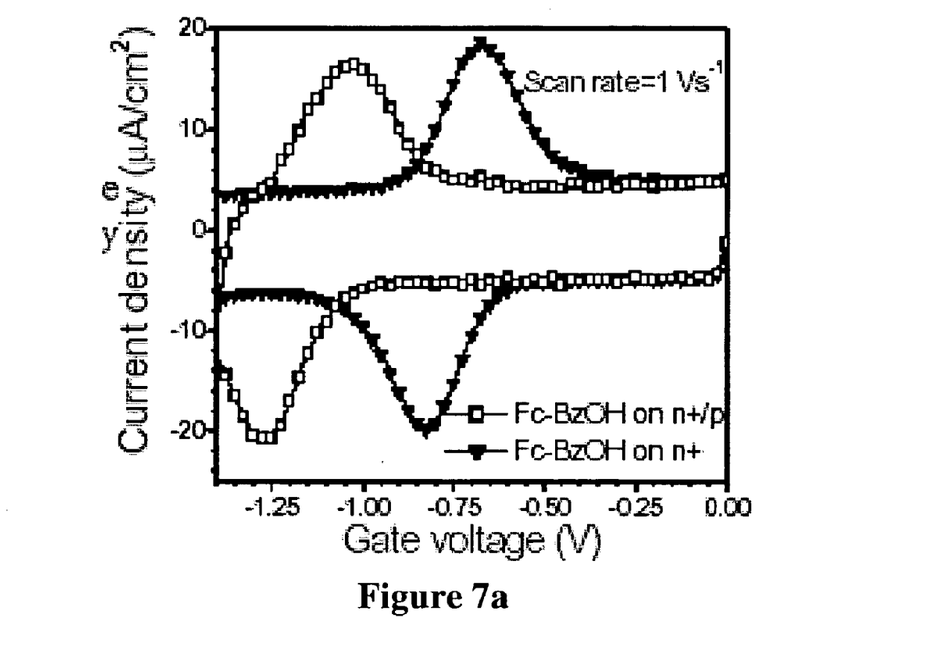
FIG. 7a CyV of Fc—BzOH on n+ and n+/p diode: effect of forwardbiased diode characteristics on redox peak potentials. Doping density of the n+ region is in the order of $1 \times 10^{21}$ cm$^{-3}$.
Figure 7B:
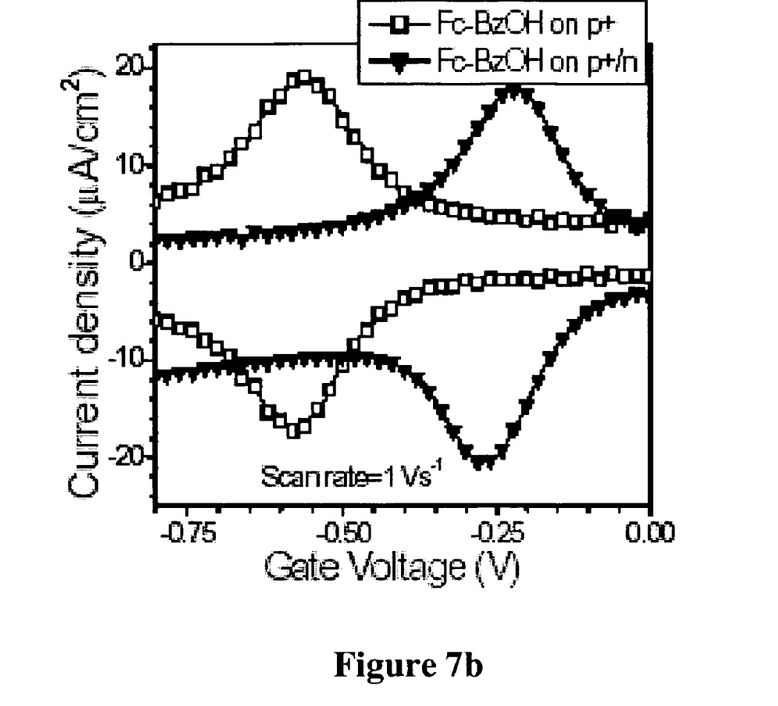
FIG. 7b CyV of Fc—BzOH on p+ and p+/n diode: effect of reverse-biased diode characteristics on redox peak potentials. Doping density of the p+ region is in the order of $1 \times 10^{21}$ cm$^{-3}$.
Figure 7C:
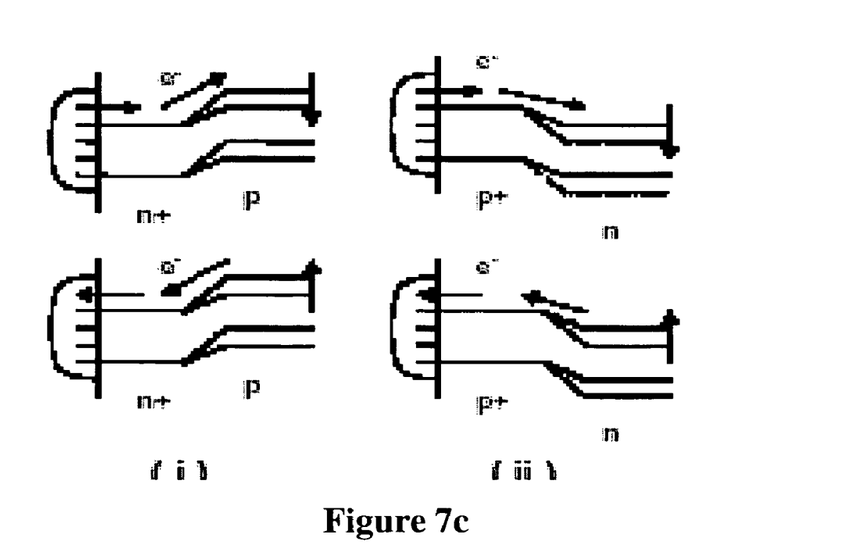
FIG. 7c (i) and (ii) Band diagrams for redox processes of molecules attached to n+/p and p+/n diode structures respectively. The top and bottom figures represent the oxidation process and reduction processes, respectively. The top arrows indicate the direction of electron flow and the side arrows indicate the movement of the energy levels as the voltage is scanned during the redox processes.

The effect of forward-biased diode characteristics on redox characteristics of Fc—BzOH monolayers (attached to n+/p diodes) was examined. FIG. 7a shows that a negative shift of ~450 mV is observed in the redox potentials when Fc—BzOH monolayers are attached to n+/p diodes, compared with attachment directly on p substrates. This shift is associated with the voltage drop occurring across the diode (the oxidation process does not require the diode to be fully on to initiate). On the other hand, a positive shift of ~300 mV is observed in the redox peak potential of the Fc—BzOH monolayers attached to p+/n diodes (FIG. 7b). The direction of the shift is associated with the reversal of the direction of the built-in potential of the p+/n diode (FIG. 7c). This result suggested that the shifts in potential could be exploited in memory devices.

Figure 8:
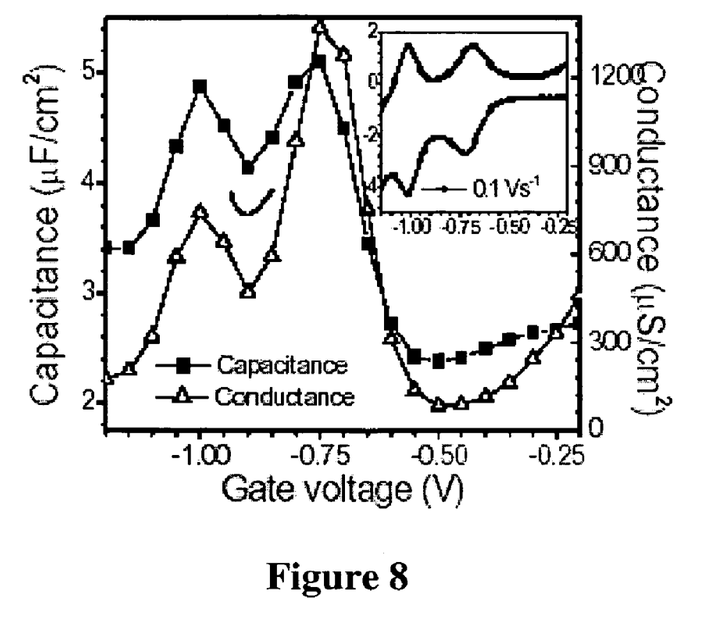
FIG. 8 CV and GV of Fc—BzOH on capacitor structure with parallel paths of p and n+/p. Two peaks correspond to redox of molecules through the two parallel paths. Inset: CyV (current density vs. gate voltage) of the structure at a scan rate of 100 mV/s.
Figure 9:
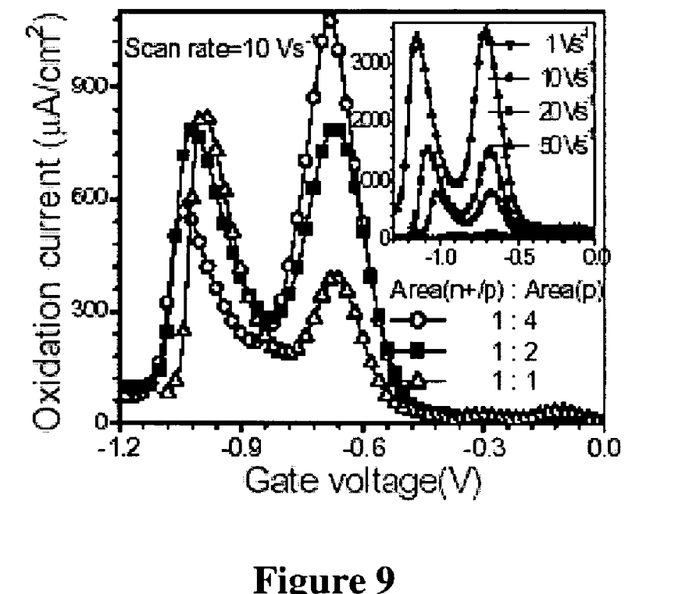
FIG. 9. Oxidation current density from CyV of Fc—BzOH on capacitors with parallel paths of p and n+/p. The ratio of the areas of n+/p and p varies from 1:1 to 1:4. Scan rate is 10 V/s. Inset: Oxidation current for a particular ratio (1:2) of n+/p and p at varying scan rates.

To take advantage of these shifts in potential, we prepared Fc—BzOH monolayers in structures with n+ pockets embedded in a p-well (or p+ pockets embedded in an n-well). CV-GV and CyV measurements of n+ pockets in a p–Si capacitor shows two distinct redox peaks (FIG. 8). The two peaks are attributed to two parallel paths of electron transfer: (1) electron transfer between molecules and p–Si and (2) electron transfer between molecules and n+/p–Si diodes (Table 1a). The existence of two redox peaks illustrates the existence of independent parallel EMS paths. In addition, these results indicate that the molecules are discrete and do not conduct to a significant degree in the lateral direction. The absence of lateral conduction (versus conduction with the surface) is not surprising given the discrete nature of the molecules, the absence of lateral connections between molecules, and the presence of a tether between the molecules and the surface. The relative magnitudes of the oxidation peak current are obtained from the CyV measurements. As indicated in FIG. 9, the peak intensities are proportional to the relative areas of the n+ and p–Si regions. For p+ pockets in n-well, only one peak is observed since both p+/n and n–Si have the same peak potential, as seen in Table 1a.

Figure 10A:
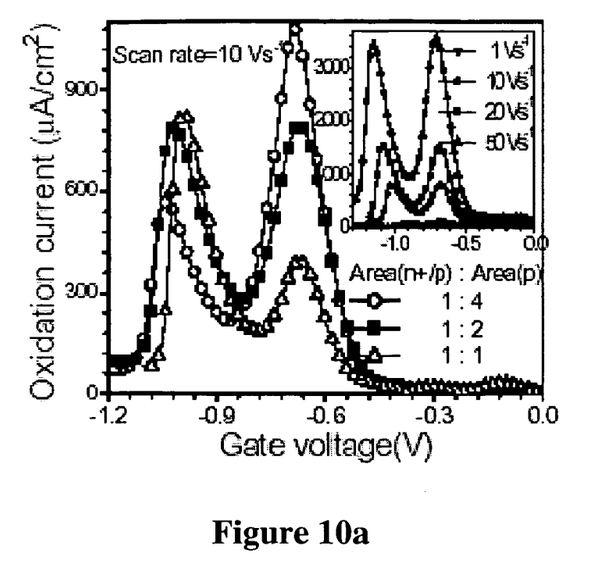
FIG. 10a CyV of Fc—BzOH on n+/p diode structures at varying scan rates: effect of scan rate on reduction.
Figure 10B:
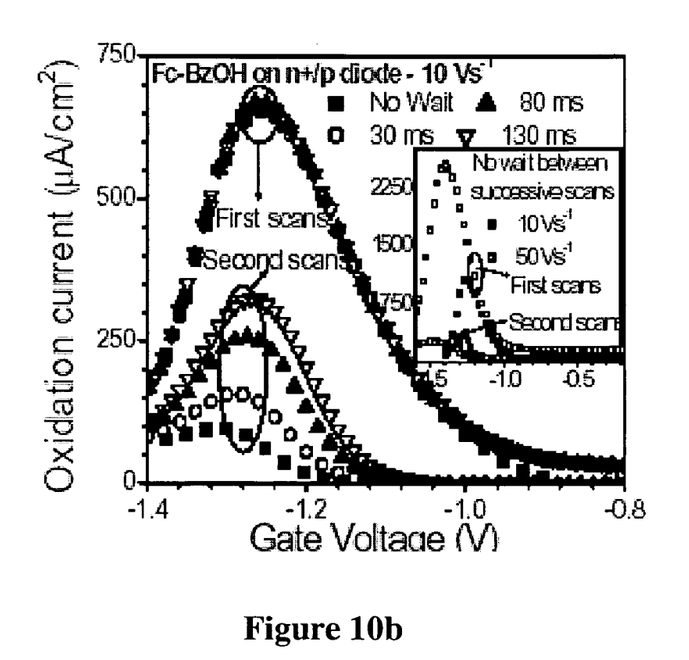
FIG. 10b Effect of wait time between scans on oxidation of Fc—BzOH on n+/p diode structures. The gate was at a potential less negative than the reduction potential during the wait time between scans. The oxidation peak in the second scan is lower than that in the first, but increases with increasing wait time. Inset: Oxidation current at two different scan rates, 10 V/s and 50 V/s, with no wait time between subsequent scans at each scan FIG. 10c Effect of light on oxidation current density of Fc—BzOH on n+/p diode structures. The oxidation current in the second scan increases with light intensity. Inset: Oxidation current density remains the same in the second scan under light.
Figure 10C:
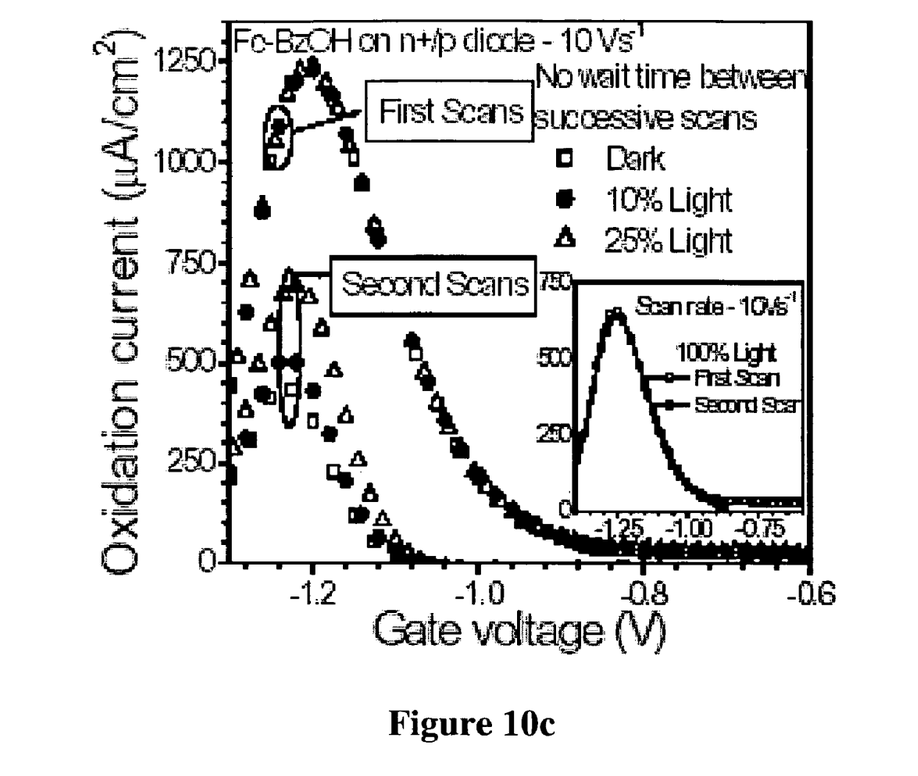
Figure 11A:
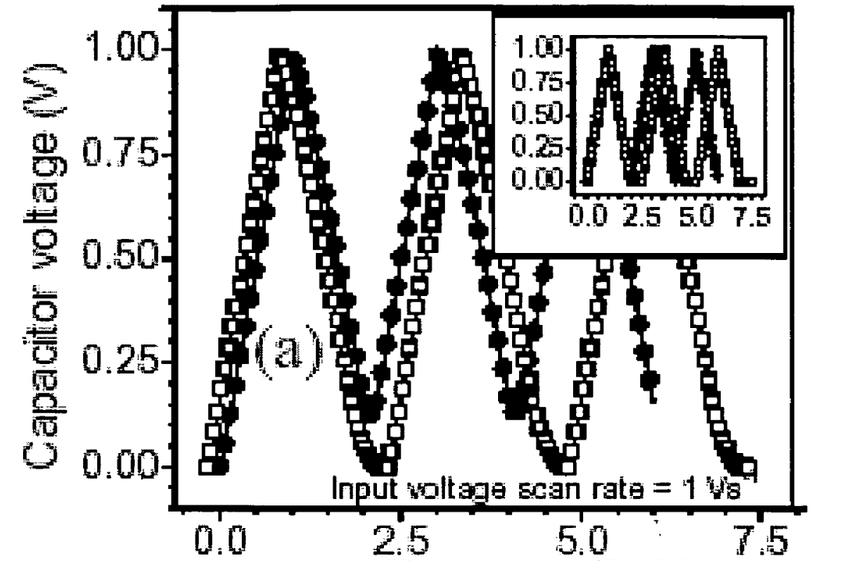
FIGS. 11a, b. Hspice simulations of the voltage across the capacitor as the input is scanned from 0 to 1 V, at a scan rate of 1V/sec (FIG. 11a) and 10 V/s (FIG. 11b). Two different wait times (0 and 0.5 sec) are used. Inset shows the input signal.
Figure 11B:
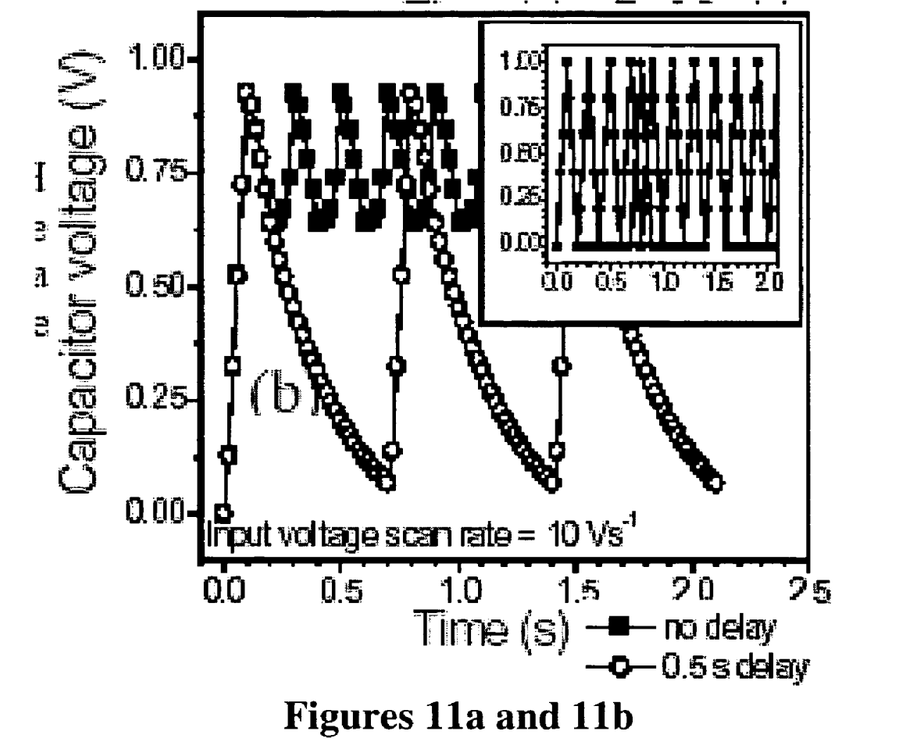
Figure 11C:
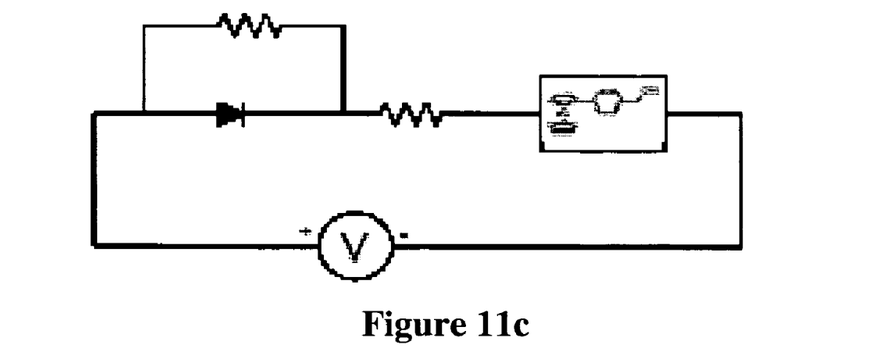
FIG. 11c HSpice circuit model used for Fc—BzOH attached on diodes. The monolayer and electrolyte was modeled as a capacitor in series with a resistance. The resistance in parallel to the diode represents diode leakage.
Figure 11D:
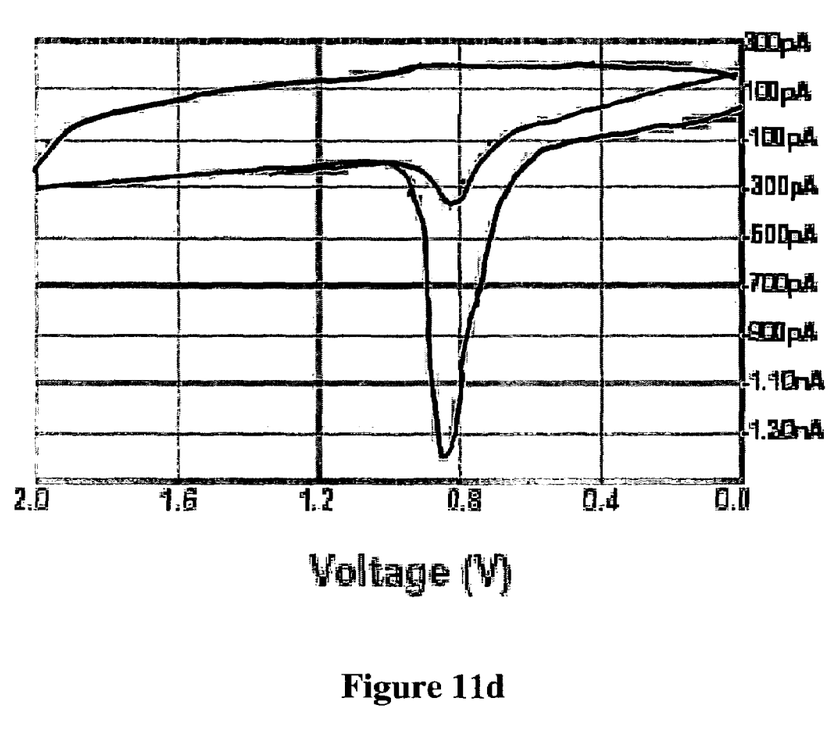
FIG. 11d Simulation plots from a series combination of Zettacore spice model for Fc—BzOH and the diode structures. Two successive scans of CyV at a scan rate of 10 V/s with no wait time between scans. Voltage shown is at the substrate and not at the gate.

The effects of scan rate on redox behavior of the Fc—BzOH monolayers on n+/p diode structures is shown in FIG. 10a. At scan rates higher than 5 V/s, the reduction current decreased for molecules attached to n+/p diodes. To evaluate whether the lack of the reduction current also impacted the subsequent oxidation, various wait times were implemented between scans where 1 scan cycle includes oxidation and reduction. As shown in FIG. 10b, a decrease in the wait time between cycles resulted in a commensurate decrease in subsequent oxidation current. Indeed, continuous scanning revealed that after the disappearance of the reduction current, the next oxidation current was minimal. Similarly, the use of light to modulate the number of minority carriers altered the observed redox characteristics with scan rate and/or wait time between scans (FIG. 10c). As light intensity was increased, the subsequent oxidation currents were found to match the initial currents. The mechanism leading to the above results is discussed in the next section.

Spice simulations were performed on the basis of the results shown in FIGS. 7–11. The simulations revealed that during the on (oxidizing) sweep, the voltage across the capacitor rapidly reaches the input potential because the diode is conducting; however, during the off (reducing) ramp, the capacitor discharge is limited by the diode reverse leakage. For example, longer wait times, slower scan rates or illumination will allow the capacitor to discharge, thereby allowing the molecules to reduce (FIGS. 11a,b). However, under very fast ramps, the capacitor is now allowed to discharge and therefore a reducing voltage will not develop across the molecules. This can be a very attractive route to achieve non-volatile memory. To prove the above mechanism, a ZettaCore spice model (FIG. 11c) for the Fc—BzOH monolayer was modeled in series with the diode structures. The simulations were in good agreement with experimental observations, as shown in FIG. 11d. The charge retention times (measured via OCPA techniques) indicate that the Fc—BzOH monolayers on n+/p–Si diodes had t1/2 values of 200 seconds as compared to 80 seconds for molecules attached to directly to p–Si capacitors. This indicates that the reduction processes are suppressed in diode structures, thereby increasing retention times.

TABLE 1a

Peak potentials for Fc-BzOH on various structures.[1]

| Structure | Peak potential (V) | |
|---|---|---|
| n | 0.32 | |
| p | 0.67 | |
| n+/p | 1.08 | |
| p+/n | 0.32 | |
| | 1st peak | 2nd peak |
| n+/p:p::1:1 | 0.67 | 0.99 |
| n+/p:p::1:2 | 0.67 | 1.02 |
| n+/p:p::1:4 | 0.68 | 1.04 |
| p+/n:n::1:1 | 0.35 | |

[1]Two peaks appear for the capacitor structures with parallel paths of n+/p and p, corresponding to the two parallel paths.

TABLE 1b

Redox-active charge density for Fc-BzOH on capacitor structures with varying ratios of n+/p and p (or p+/n and n).[2]

| | Charge density ($10^{14}$/cm$^2$) | | |
|---|---|---|---|
| Structure | 1st peak | 2nd peak | Total |
| n+/p:p::1:1 | 0.35 | 0.65 | 1.00 |
| n+/p:p::1:2 | 0.60 | 0.50 | 1.10 |

TABLE 1b-continued

Redox-active charge density for Fc-BzOH on capacitor structures with varying ratios of n+/p and p (or p+/n and n).[2]

| | Charge density ($10^{14}$/cm$^2$) | | |
|---|---|---|---|
| Structure | 1st peak | 2nd peak | Total |
| n+/p:p::1:4 | 0.90 | 0.30 | 1.20 |
| p+/n:n | 1.40 | — | 1.40 |

[2]Two peaks appear for the capacitor structures with parallel paths of n+/p and p, corresponding to the two parallel paths. Charge densities are calculated by dividing the area under peak by the active area (100 um$^2$) times the electronic charge. Charge densities obtained on n or p substrate ~1.3 × $10^{14}$ cm$^{-2}$.

The foregoing is illustrative of the present invention, and is not to be construed as limiting thereof. The invention is defined by the following claims, with equivalents of the claims to be included therein.

That which is claimed is:

1. A hybrid microelectronic memory device, comprising:
   (a) a substrate having a surface, a first region of first work function adjacent said surface, and a second region of second work function adjacent said surface and adjacent said first region;
   (b) a film comprising redox-active molecules on said first and second regions; and
   (c) an electrode connected to said film.

2. The device of claim 1, wherein said first and second regions have work functions that differ by at least 0.3 eV.

3. The device of claim 1, wherein said first and second regions are spaced apart from one another.

4. The device of claim 1, wherein said film is characterized by the absence of substantial lateral conductivity.

5. The device of claim 1, wherein said first and second regions are doped regions in said substrate.

6. The device of claim 1, wherein said first and second regions are N+pockets in a p-well substrate.

7. The device of claim 1, wherein said first and second regions are P+pockets in an n-well substrate.

8. The device of claim 1, wherein said first and second regions are each stacked vertically on said surface.

9. The device of claim 1, wherein said first and second regions comprise metal or metal oxides on said substrate.

10. The device of claim 1, wherein said substrate comprises silicon.

11. The device according to claim 1, wherein said redox-active molecules comprise a metallocene.

12. The device according to claim 1, wherein said redox-active molecules comprise a porphyrinic macrocycle.

13. The device according to claim 1, wherein said redox-active molecules comprise a sandwich coordination compound.

14. A method of storing data, comprising:
   (a) providing an apparatus according to claim 1, and
   (b) applying a voltage to said electrode to set an oxidation state of said redox active molecules;
   and wherein said redox active molecules adjacent said first region include a different oxidation state from said redox active molecules adjacent said second region.

15. A hybrid microelectronic memory device, comprising:
   (a) a substrate having a surface, a first region adjacent said surface, and a second region different from said first region on said first region, wherein said first and second regions form a structure that depletes minority carriers from said second region;
   (b) a film comprising redox-active molecules on said second region; and
   (c) an electrode connected to said redox active molecules opposite said substrate surface.

16. The device of claim 15, wherein said first and second regions together form a diode.

17. The device of claim 15, wherein said first region is n-doped and said second region is p-doped.

18. The device of claim 15, wherein said first region is p-doped and said second region is n-doped.

19. The device of claim 15, wherein said first region is n-doped and said second region comprises a metal.

20. The device of claim 15, wherein said first region is p-doped and said second region comprises a metal.

21. The device of claim 15, wherein said first and second regions are each portions of a graded p-layer.

22. The device of claim 15, wherein said first and second regions are each portions of a graded n-layer.

23. The device according to claim 15, wherein said redox-active molecule comprises a metallocene.

24. The device according to claim 15, wherein said redox-active molecule comprises a porphyrinic macrocycle.

25. The device according to claim 15, wherein said redox-active molecule comprises a sandwich coordination compound.

26. A method of storing data, comprising:
   (a) providing an apparatus according to claim 15, and
   (b) applying a voltage to said electrode to set an oxidation state of said redox active molecules.

27. The method of claim 26, further comprising the step of biasing said diode to inhibit reduction of said redox active molecules and increase the retention time of said memory device.

28. The method of claim 27, said memory device having a t1/2 of at least 200 seconds.

29. A method of determining the lateral conductivity of a redox-active molecule when deposited as a film on a substrate, comprising the steps of:
   (a) providing a substrate having a surface, a first region of first conductivity type adjacent said surface, and a second region of second conductivity type adjacent said surface and adjacent said first region;
   (b) depositing a film comprising said redox-active molecule on said first and second regions; and
   (c) determining the presence of an additional oxidation state from said film due to the presence of said second region of second conductivity type to thereby determine the lateral conductivity of said redox-active molecule when deposited as a film on said substrate.

30. The method of claim 29, wherein the presence of said second oxidation state indicating the absence of substantial lateral conductivity of said redox active molecule deposited as a film on said substrate.

31. The method of claim 29, wherein said determining step is carried out by cyclic voltammetry.

* * * * *